(12) United States Patent
Spica

(10) Patent No.: US 12,057,183 B2
(45) Date of Patent: *Aug. 6, 2024

(54) TEST ACCESS PORT ARCHITECTURE TO FACILITATE MULTIPLE TESTING MODES

(71) Applicant: Micron Technology, Inc., Boise, ID (US)

(72) Inventor: Michael Richard Spica, Eagle, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/573,257

(22) Filed: Jan. 11, 2022

(65) Prior Publication Data

US 2022/0130483 A1 Apr. 28, 2022

Related U.S. Application Data

(63) Continuation of application No. 17/100,647, filed on Nov. 20, 2020, now Pat. No. 11,250,928, which is a
(Continued)

(51) Int. Cl.
*G11C 29/38* (2006.01)
*G01R 31/3177* (2006.01)
(Continued)

(52) U.S. Cl.
CPC .......... *G11C 29/38* (2013.01); *G01R 31/3177* (2013.01); *G11C 29/36* (2013.01);
(Continued)

(58) Field of Classification Search
CPC ........ G01R 31/3177; G01R 31/318555; G01R 31/318536; G01R 31/318575;
(Continued)

(56) References Cited

U.S. PATENT DOCUMENTS 5,103,450 A 4/1992 Whetsel
5,430,735 A * 7/1995 Sauerwald ..... G01R 31/318555
714/733
(Continued)

FOREIGN PATENT DOCUMENTS

CN 113544650 A 10/2021
WO WO-2020167556 A1 8/2020

OTHER PUBLICATIONS

"Chinese Application Serial No. 202080019593.X, Office Action mailed May 9, 2022", With English Translation, 14 pgs.
(Continued)

*Primary Examiner* — April Y Blair
*Assistant Examiner* — Sazzad Hossain
(74) *Attorney, Agent, or Firm* — Schwegman Lundberg & Woessner, P.A.

(57) ABSTRACT

A system comprises a testing mode register, a set of pins, and a test access port controller. The test access port controller initiates a first testing mode by configuring the set of pins according to a first pin protocol. The test access port controller configures a first pin to receive first test pattern data based on a first convention and configures a second pin to output first test result data based on the first test pattern data. Based on detecting a register command stored in the testing mode register, the test access port controller initiates a second testing mode by configuring the set of pins according to a second pin protocol. The test access port controller configures the first pin to receive a second test pattern data generated based on a second convention and configures the second pin to output a second test result data based on the second test pattern data.

20 Claims, 8 Drawing Sheets

Related U.S. Application Data continuation of application No. 16/274,102, filed on Feb. 12, 2019, now Pat. No. 10,867,689.

(51) Int. Cl.
*G11C 29/36* (2006.01)
*G01R 31/317* (2006.01)
*G01R 31/3185* (2006.01)
*G11C 29/32* (2006.01)
*G11C 29/48* (2006.01)

(52) U.S. Cl.
CPC .............. *G01R 31/31724* (2013.01); *G01R 31/318536* (2013.01); *G01R 31/318555* (2013.01); *G01R 31/318566* (2013.01); *G01R 31/318572* (2013.01); *G01R 31/318575* (2013.01); *G11C 2029/3202* (2013.01); *G11C 29/48* (2013.01)

(58) Field of Classification Search
CPC ...... G01R 31/318566; G01R 31/31724; G01R 31/318572; G11C 29/48; G11C 2029/3202; G11C 29/38; G11C 29/36
See application file for complete search history.

(56) References Cited

U.S. PATENT DOCUMENTS

| | | | |
|---|---|---|---|
| 5,793,778 A * | 8/1998 | Qureshi | G01R 31/318536 714/727 |
| 6,888,765 B1 | 5/2005 | Kotowski et al. | |
| 7,526,693 B1 * | 4/2009 | Willis | G06F 11/2284 714/36 |
| 10,867,689 B2 * | 12/2020 | Spica | G11C 29/38 |
| 11,250,928 B2 * | 2/2022 | Spica | G11C 29/36 |
| 2005/0018480 A1 * | 1/2005 | Choi | G11C 16/26 365/185.01 |
| 2006/0069974 A1 | 3/2006 | Herrmann et al. | |
| 2006/0248419 A1 * | 11/2006 | Colunga | G01R 31/318555 714/727 |
| 2007/0013402 A1 | 1/2007 | Ong et al. | |
| 2008/0104448 A1 * | 5/2008 | Tamura | G01R 31/31727 714/40 |
| 2011/0231720 A1 | 9/2011 | Zuo et al. | |
| 2012/0191402 A1 | 7/2012 | Filler et al. | |
| 2015/0089164 A1 | 3/2015 | Ware et al. | |
| 2017/0062077 A1 | 3/2017 | Kada et al. | |
| 2017/0115338 A1 | 4/2017 | Chadalavda et al. | |
| 2017/0133070 A1 | 5/2017 | Ware et al. | |
| 2017/0269145 A1 | 9/2017 | Whetsel | |
| 2018/0292458 A1 * | 10/2018 | Lillestolen | G01R 31/318588 |
| 2019/0018061 A1 | 1/2019 | Gentner et al. | |
| 2020/0258590 A1 | 8/2020 | Spica | |
| 2021/0104290 A1 | 4/2021 | Spica | |

OTHER PUBLICATIONS

"Chinese Application Serial No. 202080019593.X, Response filed Sep. 26, 2022 to Office Action mailed May 9, 2022", with English claims, 27 pages.

"Chinese Application Serial No. 202080019593.X, Office Action mailed Nov. 7, 2022", with English translation, 10 pages.

"International Application Serial No. PCT/US2020/016812, International Preliminary Report on Patentability mailed Aug. 26, 2021", 7 pgs.

"International Application Serial No. PCT/US2020/016812, International Search Report mailed Jun. 18, 2020", 3 pgs.

"International Application Serial No. PCT/US2020/016812, Written Opinion mailed Jun. 18, 2020", 5 pgs.

\* cited by examiner

TEST ACCESS PORT ARCHITECTURE TO FACILITATE MULTIPLE TESTING MODES

PRIORITY APPLICATION

This application is a continuation of U.S. application Ser. No. 17/100,647, filed Nov. 20, 2020, which is a continuation of U.S. application Ser. No. 16/274,102, filed Feb. 12, 2019, now issued as U.S. Pat. No. 10,867,689, all of which are incorporated herein by reference in their entirety.

TECHNICAL FIELD

Embodiments of the disclosure relate generally to memory sub-systems and, more specifically, to structural testing of memory sub-system controllers with automated test vectors.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
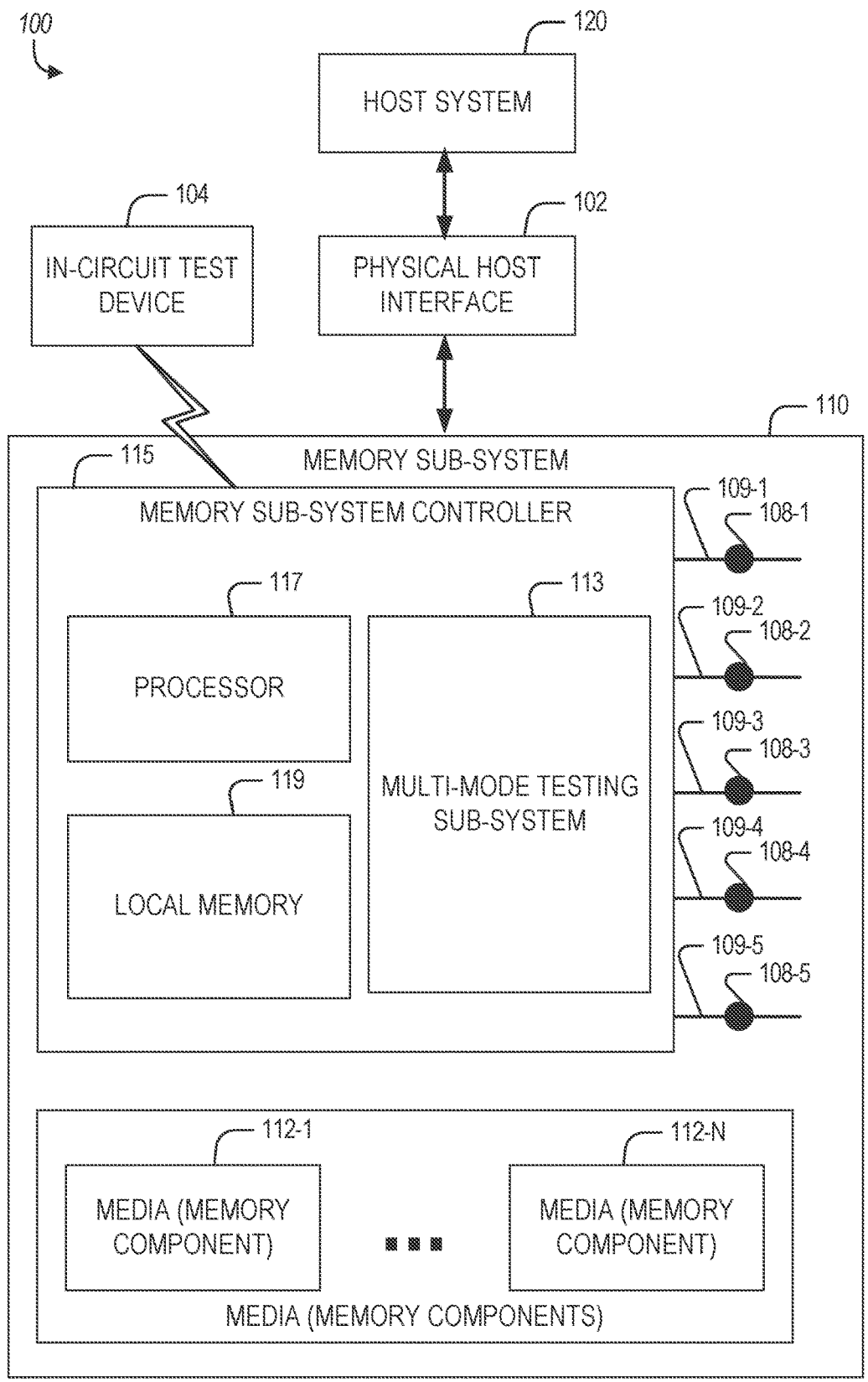
FIG. 1 illustrates an example computing environment that includes a memory sub-system, in accordance with some embodiments of the present disclosure.

Aspects of the present disclosure are directed to a test access port (TAP) architecture for facilitating multi-mode testing of a memory sub-system controller. A memory sub-system is also hereinafter referred to as a "memory device."

An example of a memory sub-system is a storage system, such as a SSD. In some embodiments, the memory sub-system is a hybrid memory/storage sub-system. In general, a host system can utilize a memory sub-system that includes one or more memory components. The host system can provide data to be stored at the memory sub-system and can request data to be retrieved from the memory sub-system. A memory sub-system controller (referred to hereinafter simply as a "controller") can receive commands or operations from the host system and can convert the commands or operations into instructions or appropriate commands to achieve the desired access to the memory components.

Manufacturing testing is performed on memory sub-systems to ensure that all components are assembled correctly and function as expected. Manufacturing testing of controllers utilizes a methodology that relies upon Automatic Test Pattern Generation (ATPG) (also referred to as "scan-based testing"). ATPG involves developing a unique set of inputs, referred to as "test vectors," to test the structure of a controller.

After manufacture of a controller on a printed circuit board (PCB), controller structure and functionality is tested and verified. Joint Test Action Group (JTAG) is an industry standard for verifying designs and testing PCBs after manufacture. JTAG specifies use of a dedicated debug port to implement a serial communications interface that provides access to a controller without requiring direct external access to the system address and data buses. The interface connects to an on-chip test access port (TAP) that implements a stateful protocol to access a set of test registers. JTAG also includes a specification for a method for testing interconnections on printed circuit boards called boundary scan testing.

Generic compliance with JTAG, boundary scan testing, and ATPG can consume numerous pins of a controller (e.g., 42 pins). However, conventional controllers often cannot support the number of pins needed for compliance with all of these testing modes because of a low pin count, and additional pins cannot be added because of design constraints such as PCB area.

Aspects of the present disclosure address the above and other deficiencies of conventional controllers in complying with JTAG, boundary scan, and ATPG by having a controller with a multi-mode testing sub-system that includes a TAP architecture that reduces the necessary pin count to facilitate multiple modes of testing. The TAP architecture comprises a TAP controller that implements a stateful protocol to configure a limited set of pins (e.g., five) of a controller according to multiple pin protocols. Each pin protocol corresponds to one of the testing modes and specifies pin assignments for the set of pins that include a prescribed function for each pin.

Initially, on power up, the TAP controller configures the set of pins of the controller according to a first pin protocol corresponding to a first testing mode. For example, the TAP controller may implement a JTAG mode by configuring pin assignments of the set of pins according to JTAG pin assignments that include a test data in (TDI) pin, a test data out (TDO) pin, a testing mode select (TMS) pin, a test clock pin (TCLK), and a test reset pin (TRST).

The multi-mode testing sub-system further comprises a testing mode register to store a register command to trigger the TAP controller to transition from the first testing mode to a second testing mode. Accordingly, based on detecting the register command asserted in the testing mode register, the TAP controller initiates a second testing mode by configuring the set of pins according to a second pin protocol.

Following the example from above, if, while in JTAG mode, the TAP controller detects the register command in the testing mode register, the TAP controller configures pin assignments of the set of pins according to scan pin assignments that include a scan-in pin, a scan-out pin, a scan enable pin, a scan clock pin, and a scan reset pin to enable ATPG-based testing methods.

The register command in the testing mode register is volatile and thus persists until a power cycling of the controller. The register command is cleared from the testing mode register after power cycling and the TAP controller reverts the controller to the first testing mode (e.g., JTAG mode).

If a TMS signal is asserted on the TMS pin while in the first testing mode, the TAP controller initiates a third testing mode at the controller by configuring the set of pins according to a third pin protocol. For example, the TAP controller may implement a boundary scan mode by configuring pin assignments of the set of pins according to boundary scan pin assignments that include a TDI pin, a TDO pin, a boundary scan mode pin, a TCLK pin, and a TRST pin to enable boundary-scan-based testing methods.

It shall be appreciated that the approach described above provides an improvement over conventional testing of memory sub-system controllers in that it reduces the necessary pin count to facilitate multiple modes of testing the memory sub-system controller. As a result, fewer pin electronic resources are consumed thereby enabling an increase in parallelism (e.g., additional devices may be tested in parallel), which in turn reduces test costs. The approach provides an additional improvement by allowing reuse of ATPG test vectors at the PCBA level thereby reducing potential redundant efforts made in developing test coverage via firmware implementation with system constraints. Such vector reuse also improves upon conventional PCBA level testing by providing determined fault coverage evaluation. What's more, by reusing the ATPG test vectors, this approach lowers the cost of execution in test time.

FIG. 1 illustrates an example computing environment 100 that includes a memory sub-system 110, in accordance with some embodiments of the present disclosure. The memory sub-system 110 can include media, such as memory components 112-1 to 112-N. The memory components 112-1 to 112-N can be volatile memory components, non-volatile memory components, or a combination of such. In some embodiments, the memory sub-system 110 is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface 102. As used herein, "coupled to" generally refers to a connection between components, which can be an indirect communicative connection or direct communicative connection (e.g., without intervening components), whether wired or wireless, including connections such as electrical, optical, magnetic, and the like. Examples of a physical host interface 102 include, but are not limited to, a serial advanced technology attachment (SATA) interface, a peripheral component interconnect express (PCIe) interface, universal serial bus (USB) interface, Fibre Channel, Serial Attached SCSI (SAS), and so forth. The physical host interface 102 can be used to transmit data between the host system 120 and the memory sub-system 110. The host system 120 can further utilize a Non-Volatile Memory (NVM) Express (NVMe) interface to access the memory components 112-1 to 112-N when the memory sub-system 110 is coupled with the host system 120 by the PCIe interface. The physical host interface 102 can provide an interface for passing control, address, data, and other signals between the memory sub-system 110 and the host system 120.

The memory components 112-1 to 112-N can include any combination of the different types of non-volatile memory components and/or volatile memory components. An example of non-volatile memory components includes a negative-and (NAND) type flash memory. Each of the memory components 112-1 to 112-N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112-1 to 112-N can be based on any other type of memory such as a volatile memory. In some embodiments, the memory components 112-1 to 112-N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, as noted above, the memory cells of the memory components 112-1 to 112-N can be grouped into memory slots that can refer to a common fixed sized unit of the memory component for allocation to a requestor and to be used to store data.

The memory sub-system controller 115 (hereinafter referred to as "controller") can communicate with the memory components 112-1 to 112-N to perform operations such as reading data, writing data, or erasing data at the memory components 112-1 to 112-N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, and the like. The local memory 119 can also include ROM for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system 110).

In general, the controller 115 can receive commands or operations from the host system 120 and can convert the commands or operations into instructions or appropriate commands to achieve the desired access to the memory components 112-1 to 112-N. The controller 115 can be responsible for other operations such as wear-leveling operations, garbage collection operations, error detection and error-correcting code (ECC) operations, encryption operations, caching operations, and address translations between a logical block address and a physical block address that are associated with the memory components 112-1 to 112-N. The controller 115 can further include host interface circuitry to communicate with the host system 120 via the physical host interface 102. The host interface circuitry can convert the commands received from the host system 120 into command instructions to access the memory components 112-1 to 112-N as well as convert responses associated with the memory components 112-1 to 112-N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112-1 to 112-N.

The example computing environment 100 further includes an in-circuit test (ICT) device 104 coupled to the controller 115. The ICT device 104 is configured to perform testing on the controller 115 to verify the structure and proper functioning of the controller 115. For example, the ICT device 104 may be configured to utilize Automated Test Pattern Generation (ATPG) test vectors, which are conventionally used only in testing at the silicon level, in performing printed board assembly (PCBA) testing of the controller 115. Thus, in the context of FIG. 1, the controller 115 and the other components of the memory sub-system 110 are mounted to a printed circuit board (PCB). The ICT device 104 may be further configured to utilize JTAG and boundary scan test vectors to perform further testing of the controller 115.

The ICT device 104 may communicate with the controller 115 for testing purposes via contacts to one or more test points of the controller 115 exposed on the PCB. For example, as shown on FIG. 1, test points 108-1 to 108-5 are provided on the PCB for the controller 115. The test points 108-1 to 108-5 may include one or more stimulus points and at least one observation point. The ICT device 104 supplies test pattern data generated based on test vectors (e.g., JTAG, boundary scan, and ATPG test vectors) to the set of stimulus points and reads test result data output at an observation point in response to the test pattern data.

The test points 108-1 to 108-5 of the controller 115 are placed on test pins 109-1 to 109-5 of the controller 115. The test pins 109-1 to 109-5 of the controller 115 are traditionally referred to as "boundary scan pins" or simply as "scan pins" because these test pins 109-1 to 109-5 traditionally facilitate testing of the controller 115 using Boundary Scan Description Language (BSDL) based test vectors. Contrary to these traditional single purpose scan pins, a multi-mode testing sub-system 113 of the controller 115 works in conjunction with the test points 108-1 to 108-5 to implement a multi-purpose configuration for the test pins 109-1 to 109-5 of the controller 115 that enables testing of the controller 115 using both BSDL- and ATPG-based test vectors. More specifically, the multi-mode testing sub-system 113 of the controller 115 implements a stateful protocol to transition the controller 115 between multiple testing modes by configuring the test pins 109-1 to 109-5 according to multiple pin protocols.

Initially, on power up, the multi-mode testing sub-system 113 initiates a first testing mode at the controller 115 by configuring the test pins 109-1 to 109-5 according to a first pin protocol. The configuring of the test pins 109-1 to 109-5 may include implementing a JTAG mode by configuring pin assignments of the test pins 109-1 to 109-5 according to JTAG pin assignments that include a TDI pin, a TDO pin, a TMS pin, a TCLK pin, and a TRST pin. If, while in JTAG mode, the TMS pin is asserted (e.g., by the ICT device 104 applying a TMS signal to the TMS pin), the multi-mode testing sub-system 113 initiates a second testing mode at the controller 115 by configuring the test pins 109-1 to 109-5 according to a second pin protocol. The configuring of the test pins 109-1 to 109-5 according to the second pin protocol may include implementing a boundary scan mode by configuring pin assignments of the test pins 109-1 to 109-5 according to boundary scan pin assignments that include a TDI pin, a TDO pin, a boundary scan mode pin, a TCLK pin, and a TRST pin. If the TMS pin is not asserted, the multi-mode testing sub-system 113 maintains the first testing mode (e.g., JTAG mode) at the controller 115 unless a register command to switch the controller 115 from the first testing mode to a third testing mode is detected (e.g., in a JTAG accessible register).

If the multi-mode testing sub-system 113 detects the register command, the multi-mode testing sub-system 113 initiates a third testing mode at the controller 115 by configuring the test pins 109-1 to 109-5 according to a third pin protocol. The configuring of the test pins 109-1 to 109-5 according to the third pin protocol may include implementing a scan mode by configuring pin assignments of the test pins 109-1 to 109-5 according to scan pin assignments that include a scan-in pin, a scan-out pin, a scan enable pin, a scan clock pin, and a scan reset pin. The register command is volatile, so the multi-mode testing sub-system 113 maintains the controller 115 in the third testing mode until the register command is cleared after power cycling the controller 115, at which time the multi-mode testing sub-system 113 returns the controller 115 to the first testing mode.

With further reference to the multi-purpose configuration of test pins 109-1 to 109-5, at least some of the test pins 109-1 to 109-5 of the controller 115 may be configured to include an in-series resistor to mitigate contention that might otherwise be caused by driving the test pins 109-1 to 109-5 of the controller 115 with test signals derived from the ATPG test vectors given that other components may also be connected to the net being driven. A portion of the test pins 109-1 to 109-5 may also include an additional test point such that the test pin includes two test points—one on either side of the resistor (not illustrated in FIG. 1).

Figure 2:
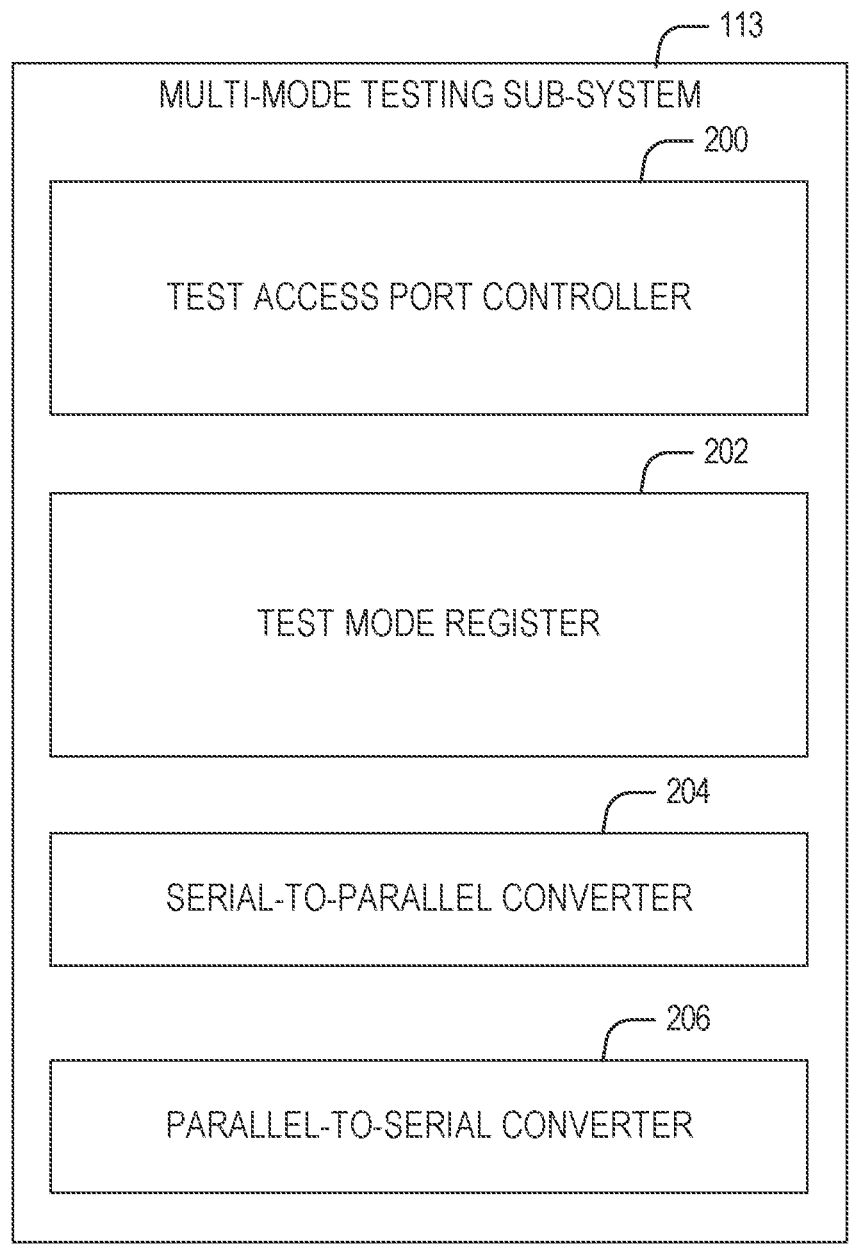
FIG. 2 is block diagram illustrating components of a multi-mode testing sub-system, which is provided as part of the memory-subsystem, in accordance with some embodiments of the present disclosure.

FIG. 2 is block diagram illustrating components of multi-mode testing sub-system 113, which is provided as part of the memory-subsystem 110, in accordance with some embodiments of the present disclosure. The multi-mode testing sub-system 113 comprises a testing mode register 202, a test access port (TAP) controller 200, a serial-to-parallel converter 204, and a parallel-to-serial converter 206. To avoid obscuring the inventive subject matter with unnecessary detail, various functional components that are not germane to conveying an understanding of the inventive subject matter have been omitted from FIG. 2. However, a skilled artisan will readily recognize that various additional functional components may be supported by the multi-mode testing sub-system 113 to facilitate additional functionality that is not specifically described herein.

The TAP controller 200 is responsible for determining a testing mode of the controller 115 and initiating the determined testing mode at the controller 115. To this end, the TAP controller 200 may include a state machine to implement a stateful protocol to transition the controller 115 between multiple testing modes. The state machine may be implemented using a combination of digital logic devices (e.g., a programmable logic device, a programmable logic controller, logic gates, flip flops, and relays). Further details regarding the state machine are discussed below in reference to FIG. 3, according to an example embodiment.

The testing mode register 202 stores a register command to trigger the TAP controller 200 to transition between a first testing mode and a second testing mode. The testing mode register 202 is a JTAG-accessible register and thus the register command may be used to trigger the TAP controller 200 to transition between a JTAG mode and a scan mode. The testing mode register 202 may be implemented in the local memory 119 of the controller 115, one or more of the memory components 112-1 to 112-N, or a local memory of the multi-mode testing sub-system 113.

The serial-to-parallel converter 204 and the parallel-to-serial converter 206 aid in facilitating scan based testing of the controller 115 while in scan mode. In particular, the serial-to-parallel converter 204 converts scan-based test pattern data that is serially scanned into a scan-in register into multiple parallel streams of bits that are fed, in parallel, into a set of scan chains. The parallel-to-serial converter 206 converts a test response that is scanned out of the set of scan chains in parallel to a bit string to form test result data. Further details regarding the function of the serial-to-parallel converter 204 and the parallel-to-serial converter 206 are illustrated in and discussed below in reference to FIG. 5, in accordance with some embodiments.

Figure 3:
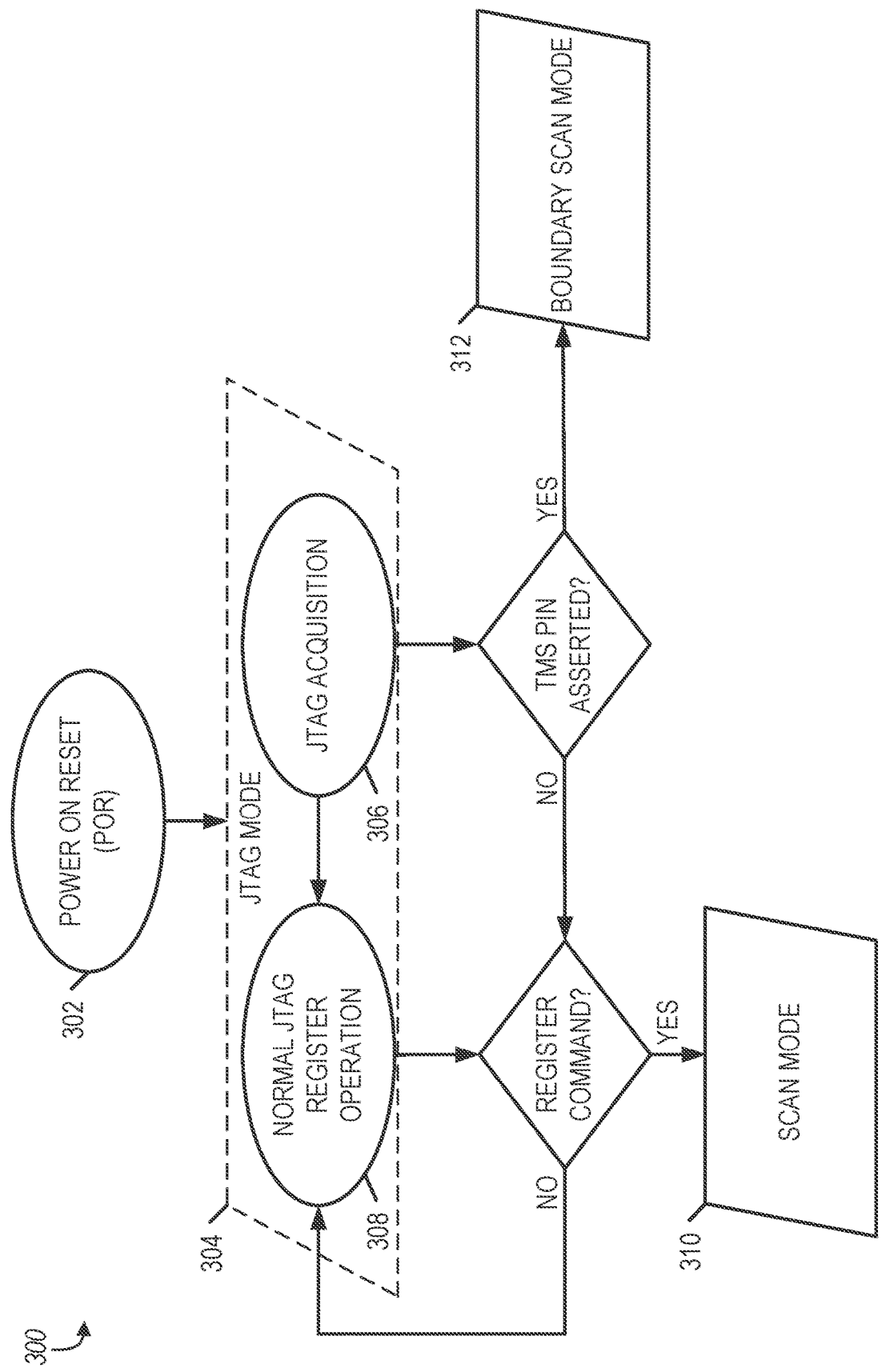
FIG. 3 is a state diagram illustrating a state machine, which may be included as part of a test access port (TAP) controller of the multi-mode testing sub-system, in accordance with some embodiments of the present disclosure.

FIG. 3 is a state diagram illustrating a state machine 300, which may be included as part of the TAP controller 200 of the multi-mode testing sub-system 113, in accordance with some embodiments of the present disclosure. The state machine 300 may be implemented using a combination of digital logic devices (e.g., a programmable logic device, a programmable logic controller, logic gates, flip flops, and relays).

As shown, power is applied to the TAP controller 200 after a reset at operation 302. Initially, after the TAP controller 200 is powered on, the TAP controller 200 is in JTAG mode 304. While in JTAG mode 304, pin assignments of the controller 115 are configured according to JTAG assignments, thereby enabling testing of the controller 115 via JTAG-based testing methods.

While in JTAG mode 304, the TAP controller 200 is initially in a JTAG acquisition state 306 in which security processes may be performed to acquire the JTAG port (e.g., security keying requirements and/or JTAG 'magic keys'). After the JTAG acquisition state 306, the TAP controller 200 transitions to a normal JTAG register operation state 308.

As shown, if a register command to switch to scan mode is detected in the testing mode register 202, TAP controller 200 initiates scan mode 310. While in scan mode 310, pin assignments of the controller 115 are configured according to scan/ATPG assignments, thereby enabling testing via ATPG-based testing methods. If no register command is detected, the TAP controller 200 remains in JTAG mode 304 unless the TMS pin is asserted (e.g., a TMS signal is asserted on the TMS pin).

As shown, if the TMS pin is asserted, the TAP controller 200 transitions to boundary-scan mode 312. While in boundary-scan mode 312, the pin assignments of the controller 115 are configured according to boundary-scan assignments, thereby enabling testing of the controller 115 via boundary-scan-based testing methods. If the TMS pin is not asserted, the TAP controller 200 remains in JTAG mode 304.

Figure 4:
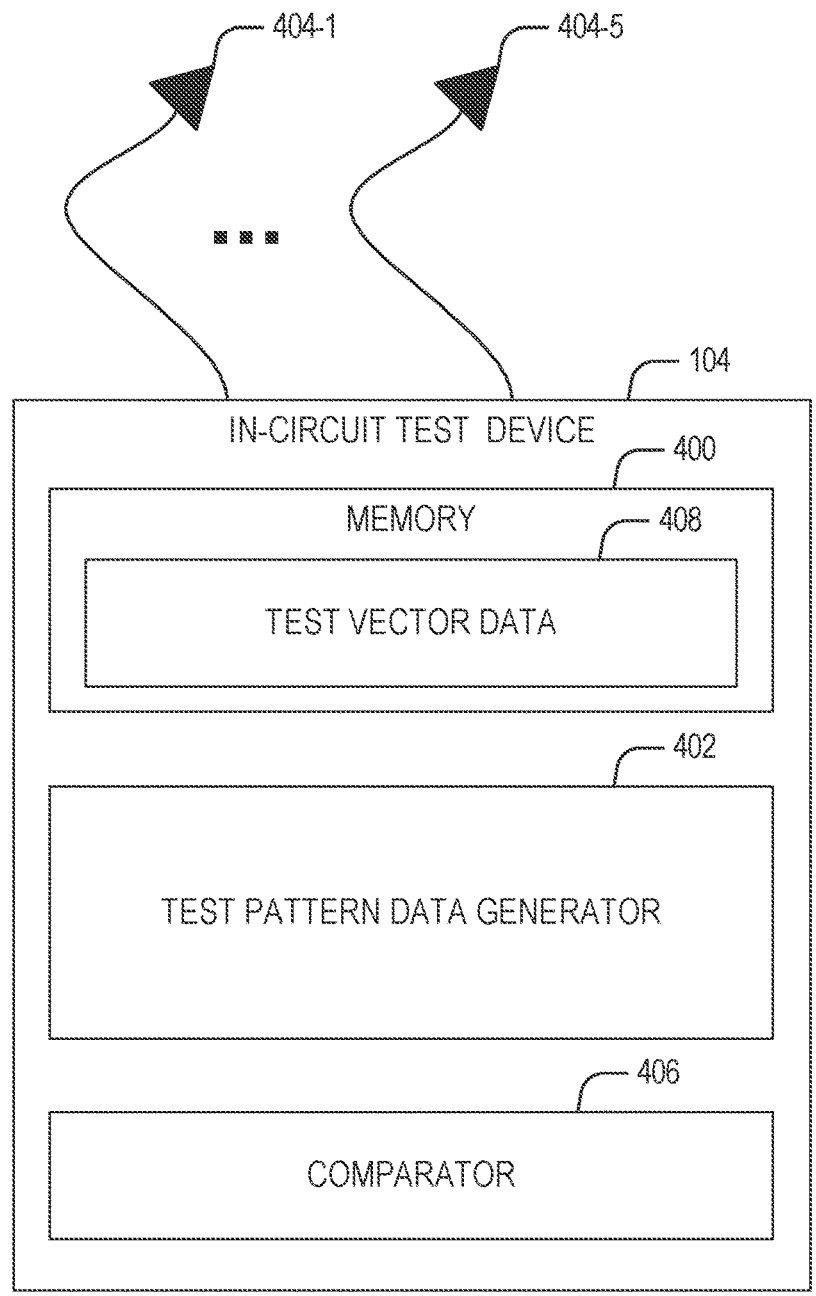
FIG. 4 is block diagram illustrating components of an in-circuit test device (ICT), in accordance with some embodiments of the present disclosure.

FIG. 4 is block diagram illustrating components of the ICT device 104, in accordance with some embodiments of the present disclosure. The ICT device 104 comprises a memory 400, a test pattern data generator 402, pin drivers 404-1 to 404-5, and comparator 406. To avoid obscuring the inventive subject matter with unnecessary detail, various functional components that are not germane to conveying an understanding of the inventive subject matter have been omitted from FIG. 4. However, a skilled artisan will readily recognize that various additional functional components may be supported by the ICT device 104 to facilitate additional functionality that is not specifically described herein.

The memory 400 stores test vector data 408. The test vector data 408 comprises input and output test vectors. The input test vectors comprise input test sequences (e.g., a binary sequence) to be applied to the controller 115 for testing purposes. The output test vectors comprise an expected output resulting from applying the input test vectors to the controller 115. The test vector data 408 may include ATPG test vector data extracted from a standard test interface language (STIL) file, which may be provided by a manufacturer of the controller 115, or BSDL test vector data corresponding to a BSDL file.

The test pattern data generator 402 generates test pattern data based on the test vector data. The test pattern data generated by the test pattern data generator 402 include electrical signals representative of the input test vectors that are suitable for driving the test points 108-1 to 108-5 on the test pins 109-1 to 109-5 of the controller 115 on the PCB. The test pattern data generator 402 may be implemented using processing logic that can include hardware (e.g., processing device, circuitry, dedicated logic, programmable logic, microcode, hardware of a device, integrated circuit, etc.), software (e.g., instructions run or executed on a processing device), or a combination thereof. For example, test pattern data generator 402 may include a set of instructions (e.g., software stored in a memory 400) that configures a processing device (e.g., a processor of ICT device 104) to generate the electrical signals.

The pin drivers 404-1 to 404-5 connect to test points 108-1 to 108-5 of the controller 115 on the PCB. More specifically, the pin drivers 404-1 to 404-5 connect to test points 108 on test-pins 109 of the controller 115 exposed on the PCB. As noted above, consistent with some embodiments, the pin drivers 404-1 to 404-5 may connect to test points 108 on scan-in, scan-out, scan enable, scan clock, scan reset, and scan control pins of the controller 115 exposed on the PCB. A first set of the pin drivers 404-1 to 404-5 applies the test pattern data to the test points 108 of controller 115 on the PCB. That is, the first set of the pin drivers 404-1 to 404-5 uses the test pattern data to drive stimulus points of the controller 115 on the PCB. As an example, a first pin driver 404-1 may drive a stimulus point on a scan-in pin of the controller 115 exposed on the PCB.

A second set of the pin drivers 404-1 to 404-5 reads test result data output at test points 108 of the controller 115 on the PCB. The test result data is output by the controller 115 as a result of applying the test pattern data to the controller 115. As an example, a second set of pin drivers 404-1 to 404-5 may read test result data output at an observation point on a scan-out pin of the controller 115 exposed on the PCB.

The comparator 406 compares the test result data from the controller 115 with the output test vectors stored in the memory 400. That is, the comparator 406 compares the test result data output by the controller 115 that result from applying the test pattern data to the controller 115 with an expected result of applying the test pattern data to the controller 115. The comparator 406 provides test result data indicative of a result of comparing the test result data with the output test vectors. In essence, the test result data indicates a positive or a negative test result. A positive test result occurs when test result data matches the expected result represented by the corresponding output test vector. A negative test result occurs when test result data does not match the expected result represented by the corresponding output test vector.

Figure 5:
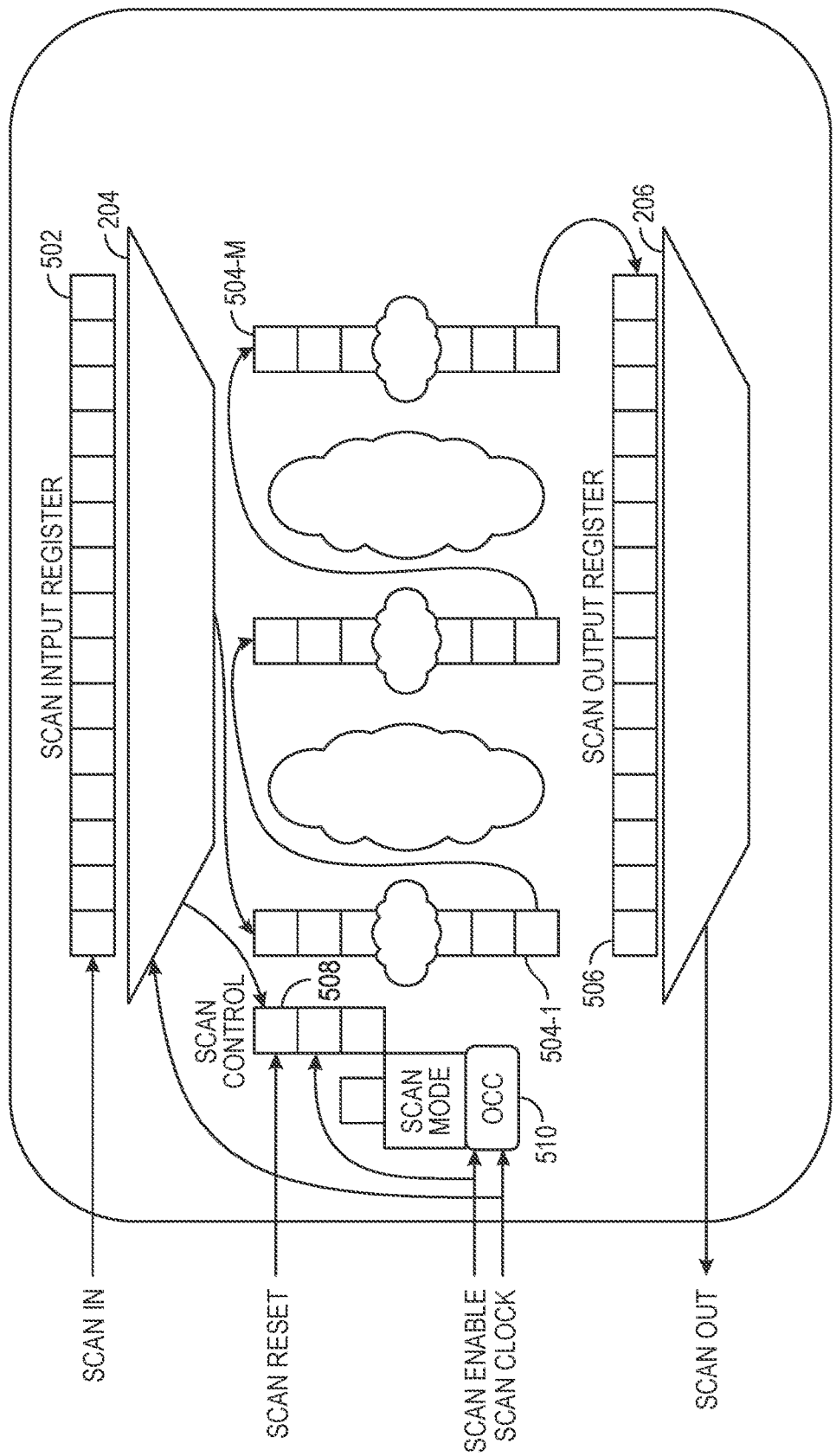
FIG. 5 is a data flow diagram illustrating operations of the multi-mode testing subsystem in performing a method for testing of a memory sub-system controller according to one of the multiple testing modes, in accordance with some embodiments of the present disclosure.

FIG. 5 is a data flow diagram illustrating operations of the multi-mode testing subsystem 113 in performing a method for scan-based testing of the controller 115 while in scan mode, in accordance with some embodiments of the present disclosure. In the context of FIG. 5, the controller 115 is in scan mode and test pattern data generated based on ATPG test vectors is supplied to the scan-in pin (e.g., by the ICT device 104). Bits of the test pattern data are serially scanned into a scan-input register 502. The serial-to-parallel converter 204 performs a serial-to-parallel conversion on the bit string stored in the scan-input register 502 to load each of scan chains 504-1 to 504-M with one or more bits in parallel.

After the scan chains 504-1 to 504-M are loaded with bits from the scan-input register 502, a test response is captured in one or more clock cycles. The captured test response is shifted out of the scan chains 504-1 to 504-M in parallel to a scan-output register 506. The parallel-to-serial converter 206 performs a parallel-to-serial conversion on the test response to generate test result data, which is output on the scan-out pin of the controller 115.

A scan control chain 508 controls which types of scan testing are executed within the scan mode. For example, the scan control chain 508 may configure the multi-mode testing sub-system 113 to run static test patterns or to perform transition fault pattern operations. As shown, the scan control chain 508 is dependent upon signals asserted on the scan rest, scan enable, and scan clock pins.

An on-chip clock controller (OCC) 510 is connected to the scan clock pin and receives a scan clock signal therefrom. The OCC 510 creates an internal launch and capture clock signal based on the received scan clock signal to facilitate certain scan-based testing operations such as transition fault pattern operations.

To avoid obscuring the inventive subject matter with unnecessary detail, various components and other details that are not germane to conveying an understanding of the inventive subject matter have been omitted from FIG. 5. For example, the combinational logic that binds the set of scan chains 504-1 to 504-M is merely represented by cloud shapes depicted between the scan chains. Further, additional scan chain length, which is dependent upon the type of scan testing being executed, is represented by cloud shapes depicted within the scan chains 504-1 to 504-M. As such, a skilled artisan will readily recognize that various additional functional components that may be included within the context of FIG. 5 to facilitate additional functionality that is not specifically described herein.

Figure 6:
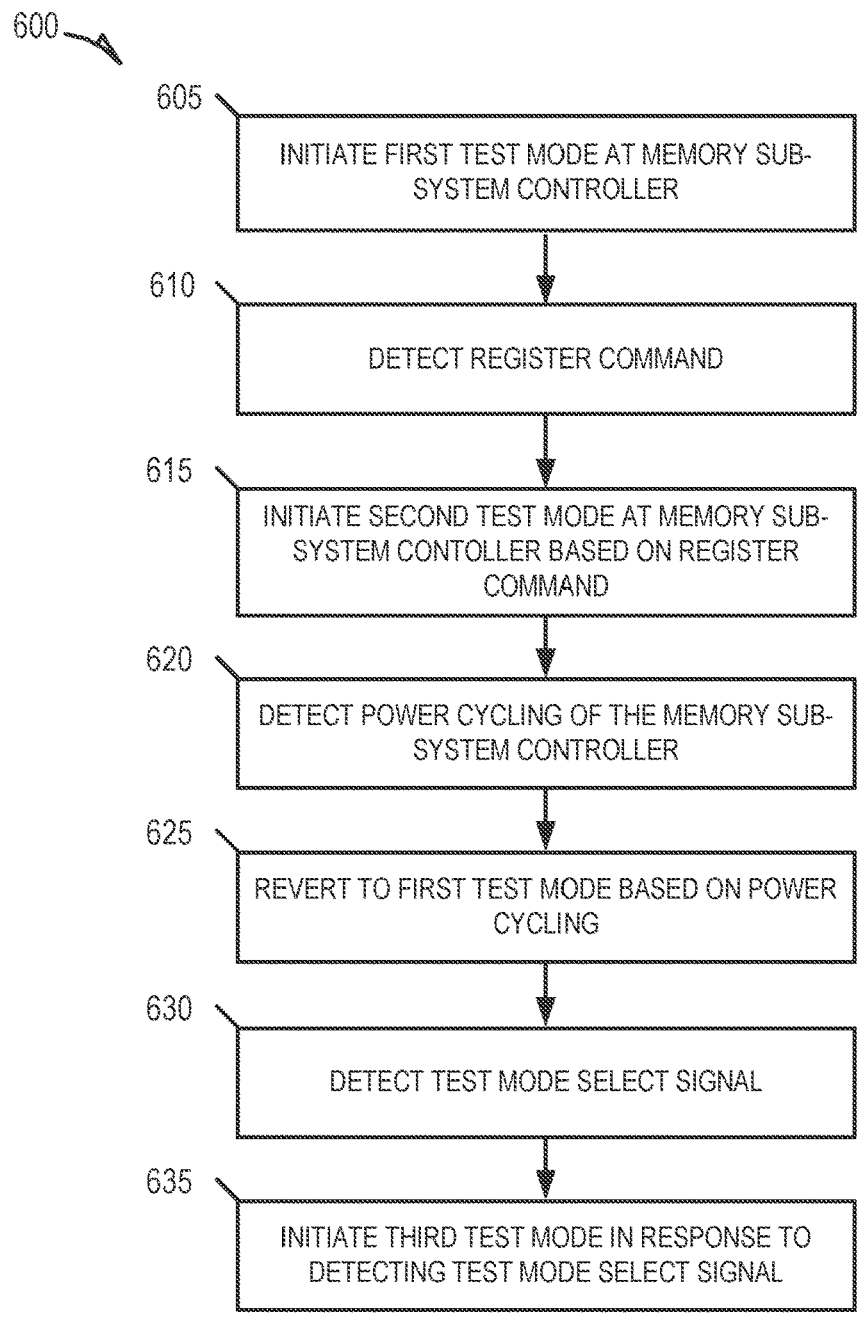
FIGS. 6 and 7 are flow diagrams of an example method to facilitate testing of a memory sub-system controller according to multiple testing modes, in accordance with some embodiments of the present disclosure.
Figure 7:
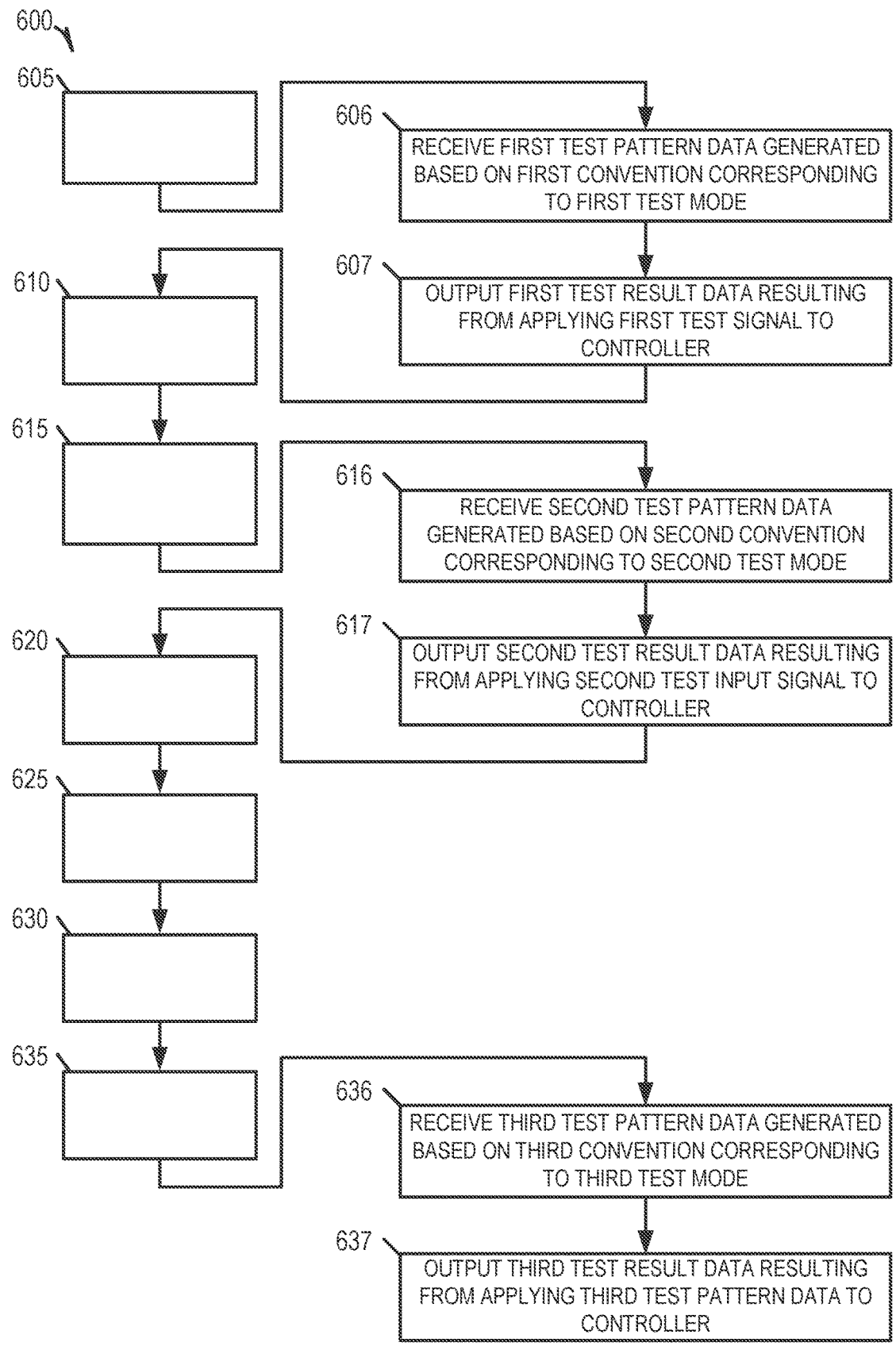

FIGS. 6 and 7 are flow diagrams of an example method 600 to facilitate testing of the memory sub-system controller 115 according to multiple testing modes, in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the multi-mode testing sub-system 113. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 605, the processing device initiates a first testing mode at an on-chip memory sub-system controller. The processing device may initiate the first testing mode after power is applied to the controller and reset on the controller is released. The initiating of the first testing mode includes configuring pins of the controller according to a first pin protocol. The configuring of the pins according to the first pin protocol includes assigning a first pin to receive first test pattern data generated based on a first convention corresponding to the first testing mode, and assigning a second pin to output first test result data resulting from applying the first test pattern data to the memory sub-system controller.

In an example, the first testing mode is a JTAG mode that enables testing of the controller using JTAG test vectors. In this example, the first pin protocol corresponds to JTAG pin assignments. Hence, the processing device configures the pins of the controller in accordance with JTAG pin assignments. For example, in configuring the pins, the processing device assigns: a first pin as a test-data-in pin to receive test pattern data generated based on JTAG test vectors; a second pin as a test-data-out pin to test result data resulting from applying the JTAG-based test pattern data to the controller; a third pin as a testing-mode-select pin to receive a testing mode select pin; a fourth pin as a test-clock-pin to receive a test clock signal; and a fifth pin as a test-reset pin to receive a test reset signal.

At operation 610, the processing device detects a register command stored in a testing mode register of the controller. The register command is an entry in the testing mode register to trigger the processing device to switch the memory sub-system controller from the first testing mode to a second testing mode. The register command may, for example, be received as a JTAG command. The register command is persistent until a power cycle is issued.

At operation 615, the processing device initiates a second testing mode at the memory sub-system controller based on detecting the register command. The initiating of the second testing mode includes reconfiguring the pins according to a second pin protocol. The reconfiguring of the pins according to the second pin protocol includes changing pin assignments of the set of pins. In changing the pin assignments, the processing device reassigns the first pin to receive a second test pattern data generated based on a second convention corresponding to the second testing mode, and reassigns the second pin to output a second test result data resulting from applying the second test pattern data to the memory sub-system controller.

In an example, the second testing mode is a scan mode that enables testing of the controller using ATPG test vectors. In this example, the second pin protocol corresponds to ATPG/scan pin assignments. For example, in reconfiguring the pins, the processing device reassigns: the first pin as a scan-in pin to receive test pattern data generated based on ATPG test vectors; the second pin as a scan-out pin to test result data resulting from applying the ATPG-based test pattern data to the controller; the third pin as a scan-enable pin to receive a scan enable signal; the fourth pin as a scan-clock pin to receive a scan clock signal; and the fifth pin as a scan-reset pin to receive a scan reset signal.

At operation 620, the processing device detects a power cycle at the memory sub-system controller. The power cycle may be a result of a reset signal asserted at the memory sub-system controller. The reset signal may be received via one of the set of pins or via a separate control mechanism provided by the memory sub-system controller.

As noted above, the register command is persistent until a power cycle of the memory sub-system controller. Hence, the power cycling of the memory sub-system clears the register command from the testing mode register. Accordingly, at operation 625, the processing device reverts the memory sub-system controller to the first testing mode (e.g., JTAG testing mode). In reverting to the first testing mode, the processing device configures the set of pins according to the first pin protocol. For example, the processing device may configure pin assignments of the set of pins according to JTAG pin assignments.

At operation 625, the processing device detects a testing mode select signal asserted on one of the set of pins. For example, the testing mode select signal may be received at the pin assigned as the testing mode select pin.

At operation 630, the processing device initiates a third testing mode at the memory sub-system controller based on detecting the testing mode select signal. The initiating of the third testing mode includes reconfiguring the pins of the controller according to a third pin protocol. The reconfiguring of the set of pins according to the third pin protocol includes reassigning the first pin to receive a third test pattern data generated based on a third convention corresponding to the third testing mode, and reassigning the second pin to output a third test result data resulting from applying the third test pattern data to the memory sub-system controller.

In an example, the third testing mode is a boundary scan mode that enables testing of the controller using boundary scan test vectors. In this example, the third pin protocol corresponds to boundary scan pin assignments. According to boundary scan pin assignments, a first pin is assigned as a test-data-in pin to receive test pattern data generated based on boundary scan test vectors; a second pin is assigned as a test-data-out pin to test result data resulting from applying the boundary-scan-based test pattern data to the controller; a third pin is assigned as a boundary-scan-mode pin to receive a boundary scan mode signal; a fourth pin is assigned as a test-clock pin to receive a test clock signal; and a fifth pin is assigned as a test-reset pin to receive a test reset signal. Accordingly, in some embodiments, in initiating the third testing mode, the processing device changes the pin assignment of the third pin from the testing-mode-select pin to the boundary-scan-mode pin.

As shown in FIG. 7, the method 600 may, in some embodiments, include operations 606, 607, 616, 617, 636, and 637. Consistent with these embodiments, the operations 606 and 607 may be performed subsequent to operation 605 where the processing device initiates the first testing mode at the memory sub-system controller.

At operation 606, the processing device receives first test pattern data generated based on a first convention corresponding to the first testing mode. For example, the first test pattern data may be generated based on JTAG test vectors. The first test pattern data may be received at a pin of the memory sub-system controller assigned as the test-data-in pin (e.g., the first pin in the example described above in reference to operation 605).

At operation 607, the processing device outputs first test result data resulting from applying the first test pattern data to the memory sub-system controller. The first test result data may be output at a pin of the memory sub-system controller assigned as the test-data-out pin (e.g., the second pin in the example described above in reference to operation 605).

Consistent with these embodiments, the operations 616 and 617 may be performed subsequent to operation 615 where the processing device initiates the second testing mode at the memory sub-system controller. At operation 616, the processing device receives a second test pattern data generated based on a second convention corresponding to the second testing mode. For example, the second test pattern data may be generated based on ATPG test vectors. The second test pattern data may be received at a pin of the memory sub-system controller assigned as the scan-in pin (e.g., the first pin in the example described above in reference to operation 615).

At operation 617, the processing device outputs a second test result data resulting from applying the second test pattern data to the memory sub-system controller. The second test result data may be output at a pin of the memory sub-system controller assigned as the scan-out pin (e.g., the second pin in the example described above in reference to operation 615).

Consistent with these embodiments, the operations 636 and 637 may be performed subsequent to operation 635 where the processing device initiates the third testing mode at the memory sub-system controller.

At operation 636, the processing device receives a third test pattern data generated based on a third convention corresponding to the third testing mode. For example, the third test pattern data may be generated based on boundary scan test vectors. The third test pattern data may be received at a pin of the memory sub-system controller assigned as the test data in pin (e.g., the first pin in the example described above in reference to operation 635).

At operation 637, the processing device outputs a third test result data resulting from applying the third test pattern data to the memory sub-system controller. The third test result data may be output at a pin of the memory sub-system controller assigned as the test-data-out pin (e.g., the third pin in the example described above in reference to operation 605).

EXAMPLES

Example 1 is a memory sub-system controller comprising: a set of pins; a testing mode register to store a register command to switch the memory sub-system controller from a first testing mode to a second testing mode; and a test access port controller to perform operations comprising: initiating the first testing mode, the initiating of the first testing mode comprising configuring the set of pins according to a first pin protocol, the configuring of the set of pins according to the first pin protocol comprising: assigning a first pin to receive first test pattern data generated based on a first convention corresponding to the first testing mode; and assigning a second pin to output first test result data resulting from applying the first test pattern data to the memory sub-system controller; detecting the register command stored in the testing mode register; and based on detecting the register command, initiating the second testing mode, the initiating of the second testing mode comprising reconfiguring the set of pins according to a second pin protocol, the reconfiguring of the set of pins according to the second pin protocol comprising: reassigning the first pin to receive second test pattern data generated based on a second convention corresponding to the second testing mode; and reassigning the second pin to output second test result data resulting from applying the second test pattern data to the memory sub-system controller.

Example 2 comprises the subject matter of Example 1, wherein: the first testing mode is optionally a Joint Test Action Group (JTAG) mode that enables testing of the memory sub-system controller based on JTAG test vectors; the first test pattern data is optionally generated based on the JTAG test vectors; the second testing mode is optionally a scan mode that facilities testing of the memory sub-system controller based on Automatic Test Pattern Generation (ATPG) test vectors; and the second test pattern data is optionally generated based on the ATPG test vectors.

Example 3 comprises the subject matter of any one of Examples 1 and 2, wherein: the configuring of the set of pins according to the first pin protocol further optionally comprises: assigning a third pin as a testing mode select pin to receive a testing mode select signal; assigning a fourth pin as a test reset pin to receive a test reset signal; and assigning a fifth pin as a test clock pin to receive a test clock signal.

Example 4 comprises the subject matter of any one of Examples 1-3, wherein the reconfiguring of the set of pins according to the second pin protocol optionally further comprises: reassigning the third pin as a scan-enable pin to receive a scan-enable signal; reassigning the fourth pin as a scan-reset pin to receive a scan-reset signal; and reassigning the fifth pin as a scan-clock pin to receive a scan-clock signal.

In Example 5, the subject matter of any one of Examples 1~4 optionally further comprises: detecting a power cycle at the memory sub-system controller; and reverting to the first testing mode based on the power cycle at the memory sub-system controller, the reverting to the first testing mode comprising configuring the set of pins according to the first pin protocol.

In Example 6, the subject matter of any one of Examples 1-5 optionally further comprises: detecting, while in the first testing mode, a testing mode select signal asserted on a third pin of the set of pins; and initiating a third testing mode based on detecting the testing mode select signal asserted on the third pin of the set of pins, the initiating of the third testing mode comprising reconfiguring the set of pins according to a third pin protocol.

In Example 7, the subject matter of any one of Examples 1-6 optionally further comprises: changing a pin assignment of the third pin in the set of pins from a testing-mode-select pin to a boundary-scan-mode pin.

Example 8 comprises the subject matter of any one of Examples 1-7, wherein a third testing mode is a boundary-scan mode.

In Example 9, the subject matter of any one of Examples 1-8 optionally further comprises: a scan-in register to store the second test pattern data, the second test pattern data comprising a bit string, the second test pattern being serially scanned in to the scan-in register; a serial-to-parallel converter to perform a serial-to-parallel conversion on the bit string to load one or more bits into each scan chain in a set of scan chains; a scan-out register to store a test response shifted out of the set of scan chains; and a parallel-to-serial converter to perform a parallel-to-serial conversion on the test response to generate the second test result data.

Example 10 comprises the subject matter of any one of Examples 1-9, wherein the first pin: receives the first test pattern data while in the first testing mode; and receives the second test pattern data while in the second testing mode; and the second pin: outputs the first test result data while in the first testing mode; and outputs the second test result data while in the second testing mode.

Example 11 is a method comprising: initiating a first testing mode at a memory sub-system controller that comprises a set of pins, the initiating of the first testing mode comprising configuring the set of pins according to a first pin protocol, the configuring of the set of pins according to the first pin protocol comprising: assigning a first pin to receive first test pattern data generated based on a first convention corresponding to the first testing mode; and assigning a second pin to output first test result data resulting from applying the first test pattern data to the memory sub-system controller; detecting a register command stored in a testing mode register associated with the memory sub-system controller; and based on detecting the register command, initiating a second testing mode at the memory sub-system controller, the initiating of the second testing mode comprising reconfiguring the set of pins according to a second pin protocol, the reconfiguring of the set of pins according to the second pin protocol comprising: reassigning the first pin to receive a second test pattern data generated based on a second convention corresponding to the second testing mode; and reassigning the second pin to output a second test result data resulting from applying the second test pattern data to the memory sub-system controller.

In Example 12, the subject matter of Example 11 optionally further comprises: receiving, while in the first testing mode, the first test pattern data at the first pin, the first test pattern data being generated based on a first convention corresponding to the first testing mode; outputting, while in the first testing mode, first test result data at the second pin, the first test result data resulting from applying the first test pattern data to the memory sub-system controller; receiving, while in the second testing mode, the second test pattern data at the first pin, the second test pattern data being generated based on the second convention corresponding to the second testing mode; and outputting, while in the second testing mode, the second test result data at the second pin, the second test result data resulting from applying the second test pattern data to the memory sub-system controller.

Example 13 includes the subject matter of any one of Examples 11 and 12, wherein the first testing mode is optionally a Joint Test Action Group (JTAG) mode that enables testing of the memory sub-system controller based on JTAG test vectors; the first test pattern data is optionally generated based on the JTAG test vectors; the second testing mode is optionally a scan mode that facilities testing of the memory sub-system controller based on Automatic Test Pattern Generation (ATPG) test vectors; and the second test pattern data is optionally generated based on the ATPG test vectors.

Example 14 comprises the subject matter of any one of Examples 11-13 wherein: the configuring of the set of pins according to the first pin protocol further optionally comprises: assigning a third pin as a testing mode select pin to receive a testing mode select signal; assigning a fourth pin as a test reset pin to receive a test reset signal; and assigning a fifth pin as a test clock pin to receive a test clock signal; and wherein the reconfiguring of the set of pins according to the second pin protocol optionally further comprises: reassigning the third pin as a scan-enable pin to receive a scan-enable signal; reassigning the fourth pin as a scan-reset pin to receive a scan-reset signal; and reassigning the fifth pin as a scan-clock pin to receive a scan-clock signal.

In Example 15, the subject matter of any one of Examples 11-14 optionally further comprises: detecting a power cycle at the memory sub-system controller; and reverting to the first testing mode based on the power cycle at the memory sub-system controller, the reverting to the first testing mode comprising configuring the set of pins according to the first pin protocol.

In Example 16, the subject matter of any one of Examples 11-15 optionally further comprises: detecting, while in the first testing mode, a testing mode select signal asserted on a third pin of the set of pins; and initiating a third testing mode based on detecting the testing mode select signal asserted on the third pin of the set of pins, the initiating of the third testing mode comprising reconfiguring the set of pins according to a third pin protocol.

In Example 17, the subject matter of any one of Examples 11-16 optionally further comprises: changing a pin assignment of the third pin in the set of pins from a testing-mode-select pin to a boundary-scan-mode pin.

Example 18 comprises the subject matter of any one of Examples 11-17, wherein a third testing mode is a boundary-scan mode.

In Example 19, the subject matter of any one of Examples 11-18 optionally further comprises: serially scanning a bit string corresponding to the second test pattern data into a scan-in register; performing a serial-to-parallel conversion on the bit string to load one or more bits into each scan chain in a set of scan chains; shifting a test response out of the set of scan chains; and performing a parallel-to-serial conversion on the test response to generate the second test result data.

Example 20 is a system comprising: a memory component; and a processing device, operatively coupled to the memory component, configured to perform operations comprising: initiating a first testing mode at a memory sub-system controller that comprises a set of pins, the initiating of the first testing mode comprising configuring the set of pins according to a first pin protocol; receiving, while in the first testing mode, first test pattern data at a first pin, the first test pattern data being generated based on a first convention corresponding to the first testing mode; outputting, while in the first testing mode, first test result data at a second pin, the first test result data resulting from applying the first test pattern data to the memory sub-system controller; detecting a register command stored in a testing mode register associated with the memory sub-system controller; based on detecting the register command, initiating a second testing mode at the memory sub-system controller, the initiating of the second testing mode comprising reconfiguring the set of pins according to a second pin protocol; receiving, while in the second testing mode, a second test pattern data at the first pin, the second test pattern data being generated based on a second convention corresponding to the second testing mode; and outputting, while in the second testing mode, a second test result data at the second pin, the second test result data resulting from applying the second test pattern data to the memory sub-system controller.

Figure 8:
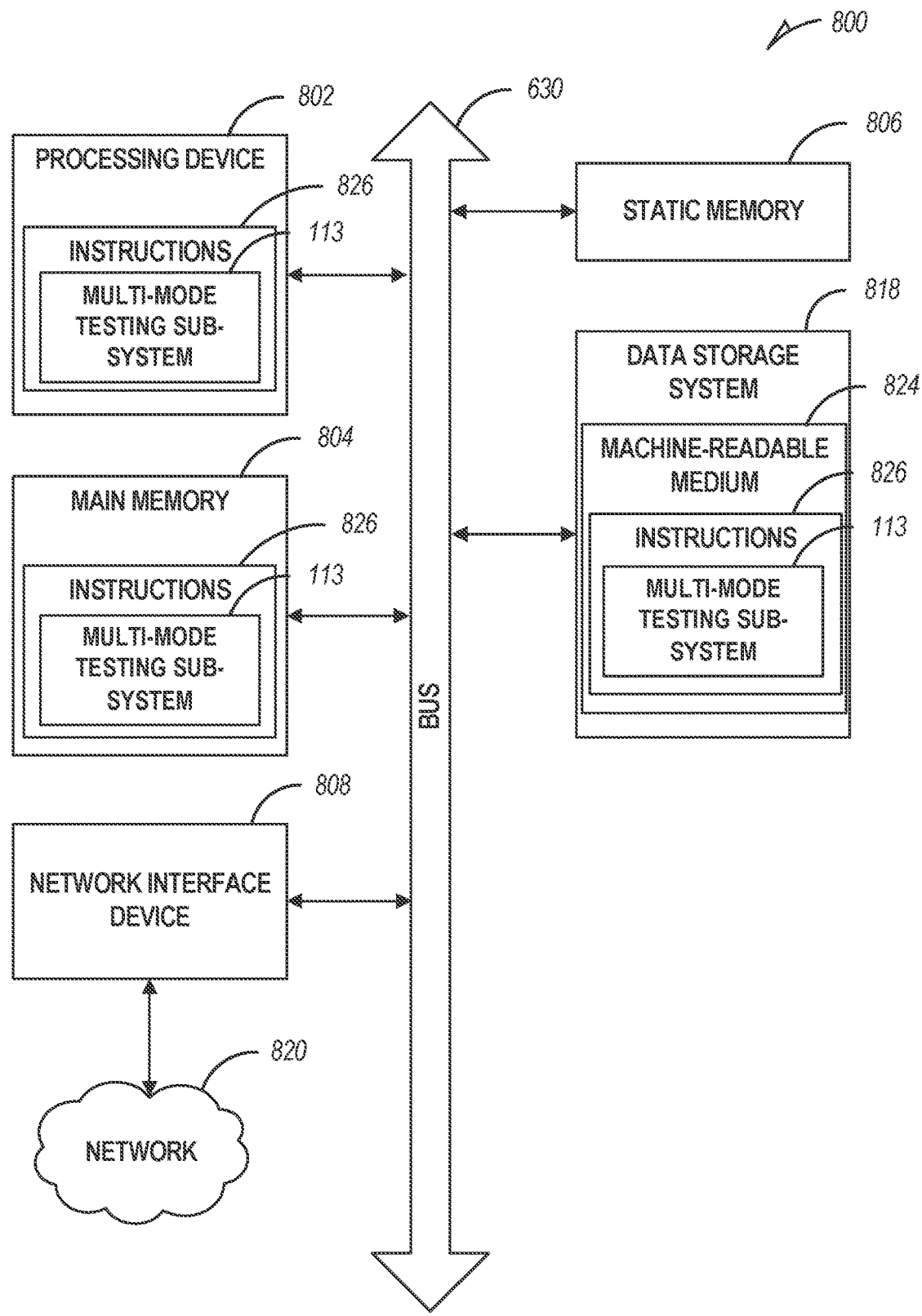
FIG. 8 is a block diagram of an example computer system in which embodiments of the present disclosure may operate.

FIG. 8 illustrates an example machine of a computer system 800 within which a set of instructions can be executed for causing the machine to perform any one or more of the methodologies discussed herein. In some embodiments, the computer system 800 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., the controller 115) or the ICT device 104 (e.g., to perform operations corresponding to multi-mode testing sub-system 113). In alternative embodiments, the machine can be connected (e.g., networked) to other machines in a local area network (LAN), an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a personal digital assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., ROM, flash memory, DRAM such as SDRAM or Rambus DRAM (RDRAM), etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device 802 can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an ASIC, a FPGA, a digital signal processor (DSP), network processor, or the like. The processing device 802 is configured to execute instructions 826 for performing the operations and steps discussed herein. The computer system 800 can further include a network interface device 808 to communicate over a network 820.

The data storage system 818 can include a machine-readable storage medium 824 (also known as a computer-readable medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media 824. The machine-readable storage medium 824, data storage system 818, and/or main memory 804 can correspond to the memory sub-system 110 of FIG. 1.

In one embodiment, the instructions 826 include instructions to implement functionality corresponding to an ICT device 104 (e.g., the functionality of the test pattern data generator 402). While the machine-readable storage medium 824 is shown in an example embodiment to be a single medium, the term "machine-readable storage medium" should be taken to include a single medium or multiple media that store the one or more sets of instructions 826. The term "machine-readable storage medium" shall also be taken to include any medium that is capable of storing or encoding a set of instructions 826 for execution by the computer system 800 and that cause the computer system 800 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. The present disclosure can refer to the action and processes of a computer system 800, or similar electronic computing device, that manipulates and transforms data represented as physical (electronic) quantities within the computer system 800's registers and memories into other data similarly represented as physical quantities within the computer system 800 memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks, ROMs, RAMs, EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description above. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a ROM, RAM, magnetic disk storage media, optical storage media, flash memory components, and so forth.

In the foregoing specification, embodiments of the disclosure have been described with reference to specific example embodiments thereof. It will be evident that various modifications can be made thereto without departing from the broader scope of embodiments of the disclosure as set forth in the following claims. The specification and drawings are, accordingly, to be regarded in an illustrative sense rather than a restrictive sense.

What is claimed is:

1. A memory sub-system controller comprising:
a set of pins; and
a processing device to perform operations comprising:
configuring the set of pins according to a first pin protocol, the first pin protocol corresponding to a Joint Test Action Group (JTAG) mode that enables testing of the memory sub-system controller based on JTAG test vectors;
based on detecting a register command to transition the memory sub-system controller from the first pin protocol to a second pin protocol, reconfiguring the set of pins according to the second pin protocol, the second pin protocol corresponding to a scan mode that enables testing of the memory sub-system controller based on Automatic Test Pattern Generation (ATPG) test vectors;
in response to a power cycle of the memory sub-system controller clearing the register command, reconfiguring the set of pins according to the first pin protocol;
detecting a testing mode select signal; and
based on detecting the testing mode select signal, reconfiguring the set of pins according to a third pin protocol, the third pin protocol corresponding to a boundary scan mode that enables testing of the memory sub-system controller using boundary scan test vectors.

2. The memory sub-system controller of claim 1, wherein the configuring of the set of pins according to the first pin protocol comprises:
assigning a first pin to receive first test pattern data generated based on a first convention; and
assigning a second pin to output first test result data resulting from applying the first test pattern data to the memory sub-system controller.

3. The memory sub-system controller of claim 2, wherein the reconfiguring of the set of pins according to the second pin protocol comprises:
reassigning the first pin to receive second test pattern data generated based on a second convention; and reassigning the second pin to output second test result data resulting from applying the second test pattern data to the memory sub-system controller.

4. The memory sub-system controller of claim 3, wherein:
the first pin:
receives the first test pattern data while configured according to the first pin protocol; and
receives the second test pattern data while configured according to the second pin protocol; and
the second pin:
outputs the first test result data while configured according to the first pin protocol; and
outputs the second test result data while configured according to the second pin protocol.

5. The memory sub-system controller of claim 3, further comprising
a scan-in register to store the second test pattern data, the second test pattern data comprising a bit string, the second test pattern being serially scanned in to the scan-in register;
a serial-to-parallel converter to perform a serial-to-parallel conversion on the bit string to load one or more bits into each scan chain in a set of scan chains;
a scan-out register to store a test response shifted out of the set of scan chains; and
a parallel-to-serial converter to perform a parallel-to-serial conversion on the test response to generate the second test result data.

6. The memory sub-system controller of claim 2, wherein the configuring of the set of pins according to the first pin protocol further comprises:
assigning a third pin as a testing mode select pin to receive a testing mode select signal;
assigning a fourth pin as a test reset pin to receive a test reset signal; and
assigning a fifth pin as a test clock pin to receive a test clock signal.

7. The memory sub-system controller of claim 6, wherein the reconfiguring of the set of pins according to the second pin protocol further comprises:
reassigning the third pin as a scan-enable pin to receive a scan-enable signal;
reassigning the fourth pin as a scan-reset pin to receive a scan-reset signal; and
reassigning the fifth pin as a scan-clock pin to receive a scan-clock signal.

8. The memory sub-system controller of claim 1, further comprising a testing mode register to store the register command, wherein detecting the register command comprises detecting the register command stored in the testing mode register.

9. The memory sub-system controller of claim 8, wherein the power cycle of the memory sub-system controller causes the register command to be cleared from the testing mode register.

10. The memory sub-system controller of claim 1, wherein the operations further comprise:
initiating a first testing mode, the initiating of the first testing mode comprising configuring the set of pins according to the first pin protocol; and
initiating a second testing mode based on the command, the initiating of the second testing mode comprising reconfiguring the set of pins according to the second pin protocol.

11. The memory sub-system controller of claim 10, wherein
the testing mode select signal is asserted on a pin of the set of pins; and
the reconfiguring of the set of pins according to the third pin protocol comprises changing a pin assignment of the pin from a testing-mode-select pin to a boundary-scan-mode pin.

12. The memory sub-system controller of claim 10, wherein:
the first testing mode is the JTAG mode that enables testing of the memory sub-system controller based on JTAG test vectors;
the second testing mode is a scan mode that facilities testing of the memory sub-system controller based on ATPG test vectors.

13. A method comprising:
configuring a set of pins of a memory sub-system controller according to a first pin protocol, the first pin protocol corresponding to a Joint Test Action Group (JTAG) mode that enables testing of the memory sub-system controller based on JTAG test vectors;
based on detecting a register command to transition the memory sub-system controller from the first pin protocol to a second pin protocol, reconfiguring the set of pins according to the second pin protocol , the second pin protocol corresponding to a scan mode that enables testing of the memory sub-system controller based on Automatic Test Pattern Generation (ATPG) test vectors; and
in response to a power cycle of the memory sub-system controller clearing the register command, reconfiguring the set of pins according to the first pin protocol;
detecting a testing mode select signal; and
based on detecting the testing mode select signal, reconfiguring the set of pins according to a third pin protocol, the third pin protocol corresponding to a boundary scan mode that enables testing of the memory sub-system controller using boundary scan test vectors.

14. The method of claim 13, wherein the configuring of the set of pins according to the first pin protocol comprises:
assigning a first pin to receive first test pattern data generated based on a first convention;
assigning a second pin to output first test result data resulting from applying the first test pattern data to the memory sub-system controller;
assigning a third pin as a testing mode select pin to receive a testing mode select signal;
assigning a fourth pin as a test reset pin to receive a test reset signal; and
assigning a fifth pin as a test clock pin to receive a test clock signal.

15. The method of claim 14, wherein the reconfiguring of the set of pins according to the second pin protocol comprises:
reassigning the first pin to receive second test pattern data generated based on a second convention;
reassigning the second pin to output second test result data resulting from applying the second test pattern data to the memory sub-system controller;
reassigning the third pin as a scan-enable pin to receive a scan-enable signal;
reassigning the fourth pin as a scan-reset pin to receive a scan-reset signal; and
reassigning the fifth pin as a scan-clock pin to receive a scan-clock signal.

16. The method of claim 15, wherein:

the first pin:

receives the first test pattern data while configured according to the first pin protocol; and receives the second test pattern data while configured according to the second pin protocol; and the second pin:

outputs the first test result data while configured according to the first pin protocol; and outputs the second test result data while configured according to the second pin protocol.

17. The method of claim 15, wherein detecting the register command comprises detecting the register command stored in a testing mode register.

18. The method of claim 17, wherein the power cycle of the memory sub-system controller causes the register command to be cleared from the testing mode register.

19. The method of claim 13, further comprising:

initiating the JTAG the initiating of the JTAG mode comprising configuring the set of pins according to the first pin protocol; and initiating the scan mode, the initiating of the scan mode comprising reconfiguring the set of pins according to the second pin protocol.

20. A system comprising:

a memory component; and a processing device, operatively coupled to the memory component, configured to perform operations comprising:

configuring a set of pins of a memory sub-system controller according to a first pin protocol, the first pin protocol corresponding to a Joint Test Action Group (JTAG) mode that enables testing of the memory sub-system controller based on JTAG test vectors;

based on detecting a register command to transition the memory sub-system controller from the first pin protocol to a second pin protocol, reconfiguring the set of pins according to the second pin protocol, the second pin protocol corresponding to a scan mode that enables testing of the memory sub-system controller based on Automatic Test Pattern Generation (ATPG) test vectors; and in response to a power cycle of the memory sub-system controller clearing the register command, reconfiguring the set of pins according to the first pin protocol;

detecting a testing mode select signal; and based on detecting the testing mode select signal, reconfiguring the set of pins according to a third pin protocol, the third pin protocol corresponding to a boundary scan mode that enables testing of the memory sub-system controller using boundary scan test vectors.

* * * * *